(12) United States Patent
Dewdney et al.

(10) Patent No.: US 7,554,327 B2
(45) Date of Patent: Jun. 30, 2009

(54) METHOD FOR DETERMINATION AND EVALUATION OF A SHIM PARAMETER SET FOR CONTROLLING A SHIM DEVICE IN A MAGNETIC RESONANCE APPARATUS

(75) Inventors: Andrew Dewdney, Neunkirchen am Brand (DE); Sabrina Harter, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 11/871,221

(22) Filed: Oct. 12, 2007

(65) Prior Publication Data

US 2008/0088307 A1   Apr. 17, 2008

(30) Foreign Application Priority Data

Oct. 12, 2006   (DE) ...................... 10 2006 048 423

(51) Int. Cl.
G01V 3/00   (2006.01)
(52) U.S. Cl. ...................................... 324/320; 324/319
(58) Field of Classification Search ................. 324/320, 324/319, 318
See application file for complete search history.

(56) References Cited

U.S. PATENT DOCUMENTS

| | | | |
|---|---|---|---|
| 5,006,804 A | | 4/1991 | Dorri et al. |
| 5,373,239 A | * | 12/1994 | Marek et al. ................. 324/320 |
| 6,634,088 B1 | * | 10/2003 | Morrone ....................... 29/607 |
| 6,714,109 B1 | * | 3/2004 | Rimkunas et al. ............ 335/301 |
| 7,215,123 B2 | * | 5/2007 | Axel ............................ 324/318 |
| 2006/0033494 A1 | | 2/2006 | Hennig et al. |

* cited by examiner

*Primary Examiner*—Louis M Arana
(74) *Attorney, Agent, or Firm*—Schiff Hardin LLP

(57) ABSTRACT

In a method for determination and evaluation of a shim parameter set for controlling a shim device in a magnetic resonance (MR) apparatus, the shim device is set using a first shim parameter set, a first field distribution is measured in a body region encompassing a target volume from which MR data are to be acquired, a second shim parameter set is determined using an algorithm for optimization of the field homogeneity in the target volume on the basis of the first shim parameter set and dependent on the first field distribution, a second field distribution is determined on the basis of the second shim parameter set, and the shim parameter sets are evaluated by indirect or direct comparison of the first field distribution and the second field distribution, in particular in the target volume.

17 Claims, 3 Drawing Sheets

METHOD FOR DETERMINATION AND EVALUATION OF A SHIM PARAMETER SET FOR CONTROLLING A SHIM DEVICE IN A MAGNETIC RESONANCE APPARATUS

BACKGROUND OF THE INVENTION

1. Field of the Invention

The present invention concerns a method for determination and evaluation of a shim parameter set for controlling a shim device in a magnetic resonance apparatus.

2. Description of the Prior Art

For image acquisition in magnetic resonance apparatuses, the homogeneity of the magnetic field in the region of interest is of great importance. Small deviations in the homogeneity can lead to large deviations of the frequency distribution, such that qualitatively substandard images are acquired.

Shim devices are known in order to improve the homogeneity in the volume of interest for an image acquisition. When a magnetic resonance apparatus is installed at its installation site, fields and field sources as well as materials present in the environment can limit the built-in homogeneity of the magnetic field of the apparatus, in particular around the isocenter. Upon installation and start-up of a magnetic resonance apparatus, the shim device is set (frequently in connection with measurements) such that as optimal a homogeneity as possible is established.

However, the subject from which image data are to be acquired itself represents a further inhomogeneity source. When, for example, a person to be examined is introduced into the magnetic resonance apparatus, the matter of the body disrupts the homogeneity again. In order to counter this problem, it is known to use re-adjustable shim devices. In particular, electrical shim coils are known that, controlled with various shim currents, generate various compensation magnetic fields in order to improve the homogeneity.

In order to shim the field in a manner specific to the subject, in order to control the shim device by means of a first shim parameter set acquired during the installation and start-up of the magnetic resonance apparatus, it is typical to first conduct a measurement of the field distribution using the magnetic resonance apparatus itself after the person to be examined has been introduced into the patient admission of the magnetic resonance apparatus. Starting from the first shim parameter set, an optimized shim parameter set is determined by a control device dependent on the measured field distribution. Using this optimized shim parameter set, the shim device is then controlled in order to optimally achieve an improved homogeneity. Various algorithms are known to determine this second shim parameter set that is optimized in an ideal manner, but certain problems arise in the known methods.

Under some circumstances the employed algorithm does not converge at an optimized shim setting. For example, this occurs when the first shim parameter set has values too far removed from the optimal possible values; a particularly large inhomogeneity thus exists. A further error source is in the measurement of the field distribution, since measurement errors can also easily lead the algorithm to false results.

In the prior art it is known to effect one or more further iterations, meaning to possibly effect further field measurements and to newly apply the algorithm until a user is of the opinion that the last determined shim parameter set is optimal.

However, with the methods known today it cannot be established whether the "optimized" second shim parameter sets are even actually optimal or whether they might even represent a worsening relative to the starting shim parameter set (in particular the first parameter set). This only after an image is generated and the subjective image quality is determined. Although the algorithm should have determined the theoretical minimum for the inhomogeneities of the field, in practice measurement uncertainties and fluctuating signal quality can misdirect the algorithm and a worsening of the shim situation can occur. A user is, so to speak, "blind" with regard to these cases.

SUMMARY OF THE INVENTION

An object of the present invention is to provide a method that allows success monitoring with regard to shim setting in the above-described context.

This object is achieved in accordance with the invention by a method including the steps of setting the shim device using a first shim parameter set, measuring a first field distribution in a body region encompassing a target volume from which image data are to be acquired, determining a second shim parameter set using an algorithm for optimization of the field homogeneity in the target volume on the basis of the first shim parameter set and dependent on the first field distribution, determining a second field distribution on the basis of the second shim parameter set, and evaluating the shim parameter sets by indirect or direct comparison of the first field distribution and the second field distribution, in particular in the target volume.

According to the invention, success monitoring is enabled by the second field distribution, as is achieved by means of the second shim parameter set, being determined and compared with the first field distribution. This comparison can be both indirect and direct. In the case of an indirect comparison at least one quality parameter from the field distribution is determined, and the evaluation occurs by comparison of the quality parameter. In this manner it is predicted or determined to what extent the new shim settings (thus the second shim parameter set) actually lead to an optimization of the homogeneity of the field in the target volume.

The evaluation result can be used in various ways that can be combined with one another. It is thus possible for the evaluation result to be displayed. This can occur by means of a suitable display device. The user is thus informed as to the extent that an improvement actually exists, and can now decide, for example, which shim parameter set the user would like to use to set the shim device. Naturally, it is also possible for a user to adapt parameters of the algorithm (in particular using a suitable input device) in order to possibly obtain a better second shim parameter set.

Alternatively or additionally, dependent on the evaluation result, the shim parameter data set that is assessed to be better can be used for setting the shim device. This advantageously occurs automatically, for example by means of a control device that also executes the algorithm. It is thus ensured that the more ideal of the two shim parameter sets is always selected. In connection with the display of the evaluation result, it is also apparent for the user when, for example, the algorithm has diverged and the first shim parameter set was set again. The user can then possibly take measures in order to effect an improved shimming manually or with altered parameters of the algorithm.

Various embodiments are possible for comparison of the field distributions. In general, these are oriented on identifying in which case the field distribution is more homogeneous, and thus more suitable for the image acquisition.

In an embodiment of the inventive method the comparison ensues by a statistical evaluation of the field distribution in the target volume. Such a statistical evaluation (for example, concerning the inhomogeneities of the field distributions) ultimately yields one or more quality parameters for each field distribution that can then be compared in the framework of the evaluation. At least one parameter describing the homogeneity of the field in the target volume is determined from the first field distribution and the second field distribution, on the basis of which parameter the comparison ensues. In a further embodiment of the invention, a histogram of the measurement values or quantities of the field distribution derived from the measurement values (in particular the deviation of an average value of the frequency) can be generated for determination of the parameter. The parameter is a parameter (in particular a full width half maximum) that reflects the characteristics of the histogram. The measurement values or the quantities derived therefrom are considered for each voxel in the target volume to generate the histogram. For example, inhomogeneities can be directly considered as deviations from a field average. However, it is advantageously possible to consider the frequency distribution. In particular the deviation from an average value of the frequency is considered in the histogram. A typical magnetic resonance signal for a voxel yields a frequency distribution having peaks that are wider the more inhomogeneous the field is. Since the frequency distribution in the target volume is narrower when the field in the target volume is more homogeneous, the frequency distribution is an appropriate measure for the achieved field homogeneity. A parameter (in particular a full width half maximum) reflecting the characteristics of the histogram then can be selected as a quality parameter. Other parameters describing the frequency distribution, for example a standard deviation, are also possible.

In the inventive method two alternatives are possible for determination of the second field distribution. The determination of the second field distribution can be accomplished by a measurement after setting of the shim device according to the second shim parameter set. The second field distribution is then measured like the first field distribution.

Alternatively, the second field distribution can be determined by computation, in particular dependent on the first field distribution. For example, a suitable computer of the magnetic resonance apparatus is then supplied with the determined second shim parameter set and calculates a predicted or theoretical second field distribution. Since only the shim parameter set is typically determined by the algorithm, the field portions that are not influenced by the modified setting of the shim device can be adopted from the first field distribution, such that ultimately only the variations due to the altered shim parameter set must be calculated. In the simplest embodiment the fields generated by the alteration are calculated and added altogether to the first field distribution.

For calculation of the second field distribution, terms of the third order and/or a higher order of a spherical function expansion can be calculated for the second field distribution. It may be that the contributions of the third order that are frequently not compensated by the shim devices represent a no-longer-negligible quantity, such that an inhomogeneity is generated that can significantly reduce the quality of the setting according to the second shim parameter set. These terms can also be taken into account by the inventive method.

It may also occur that the optimal shim setting has not yet been found after one iteration of the algorithm. A further shim parameter set as well as a further field distribution are then determined on the basis of the last determined shim parameter set in the framework of a further iteration step, and are evaluated by indirect or direct comparison with the previously determined field distributions. In further iterations of the algorithm, the respective newly obtained shim parameter set can also be evaluated in comparison to the previously determined shim parameter sets. Such a procedure can naturally be implemented multiple times, meaning that more than one further iteration step can ensue. It may also occur that the algorithm diverges again after determination of an optimal shim parameter set, meaning that the quality of the determined shim settings decreases again with increasing iteration. Therefore, the evaluation results and shim parameter sets can be stored in a storage device, so that after the last iteration step an automatic selection of the shim parameter set assessed to be best ensues for setting the shim device. An optimum that is found during an iteration chain also can be used in this manner even though the last iteration step indicates a deterioration in comparison thereto.

An iteration step can ensue upon under-run of a threshold for the improvement of the homogeneity of the field in the target volume, or according to the direction of operating personnel. In the first case an automatic shim mode exists that implements an iteration in a controlled manner, assesses the convergence or quality of the determined shim parameter set, and initiates the necessary steps (in particular automatically) to use an optimal shim parameter set for setting the shim device. In the other alternative an iteration step can ensue according to the direction of operating personnel who assesses this iteration using, for example, the evaluation results displayed to the operator. The operator thus has the freedom to decide to what extent the operator would like to optimize.

The invention also concerns a magnetic resonance apparatus that is fashioned for implementation of the inventive method.

DESCRIPTION OF THE PREFERRED EMBODIMENTS

Figure 1:
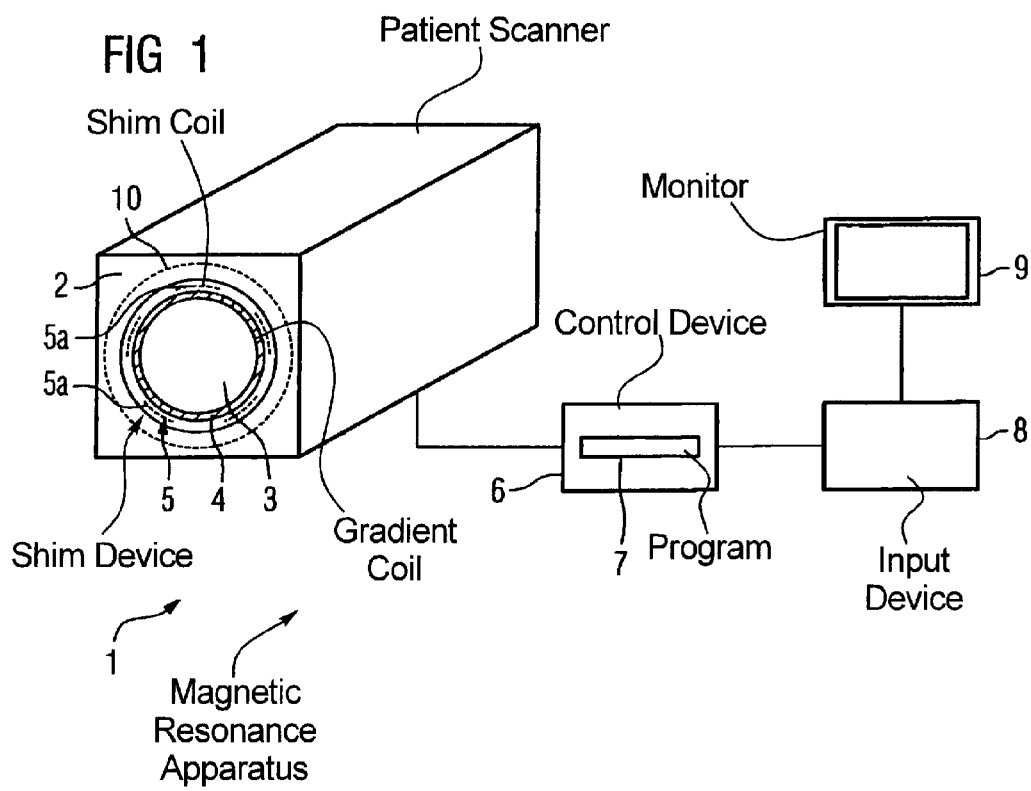
FIG. 1 schematically illustrates the basic components of an inventive magnetic resonance apparatus.

FIG. 1 shows an inventive magnetic resonance apparatus 1. The apparatus 1 has a patient scanner 2 in which the basic field magnet 10 (indicated with dashed lines) is accommodated and that defines a patient receptacle 3. The patient scanner 2 involves at least one gradient coil 4 with which a gradient field is generated that serves in a known manner for the spatial resolution (encoding) of the acquired signals. A shim device 5 that has a number of shim coils 5a (indicated with dashed lines) that can be individually fed with current is also arranged between the gradient coils 4 and the basic field magnet 10 in the patient scanner 2. The shim coils 5a serve for the generation of fields that homogenize the magnetic field in the data acquisition region. For example, five shim coils 5a can be provided that generate fields corresponding to the five field terms of a spherical function expansion of the second order.

The magnetic resonance apparatus 1 also has a control device 6 that serves for controlling the various components of the magnetic resonance apparatus 1, thus also the shim device 5. The shim coils 5a of the shim device 5 are fed with current by the control device 6 corresponding to a shim parameter set.

The control device 6 is also fashioned to determine a second shim parameter set using an algorithm for optimization of the field homogeneity in a target volume on the basis of a first shim parameter set, dependent on a first field distribution measured for the shim device 5 set according to the first shim parameter set. For example, this determination can ensue by execution of a program 7 stored in the control device 6. The program 7 is based on an algorithm.

The control device 6 is also fashioned to evaluate shim parameter sets. For this purpose, a second field distribution based on the second shim parameter set can be determined by the control device 6. There are essentially two alternatives for accomplishing this. The shim device 6 can be set according to the shim parameter set, whereupon a measurement occurs. Alternatively, it is also possible to determine the second field distribution by calculation (in particular dependent of the first field distribution) when an adjustment of the shim device 5 is not desired, for example. If the second field distribution is known, the control device 6 can thus evaluate the shim parameter sets by indirect or direct comparison of the first field distribution and the second field distribution in the target volume.

An input device 8 with an associated monitor 9 is also associated with the control device 6. Via the input device 8, a user enters inputs for controlling the magnetic resonance apparatus 1. It is also possible for the user to influence the determination of the second shim parameter set by entered parameters. For example, the evaluation result that the control device 6 has determined can be displayed to the user on the monitor 9. The selection of the shim parameter set to be used can ensue automatically, in particular based on the evaluation result, but can also occur by a user via the input device 8.

The basic design and further functions, as well as the operation of a magnetic resonance apparatus 1 are sufficiently known to those skilled in the art so as to require no further explanation herein.

Figure 2:
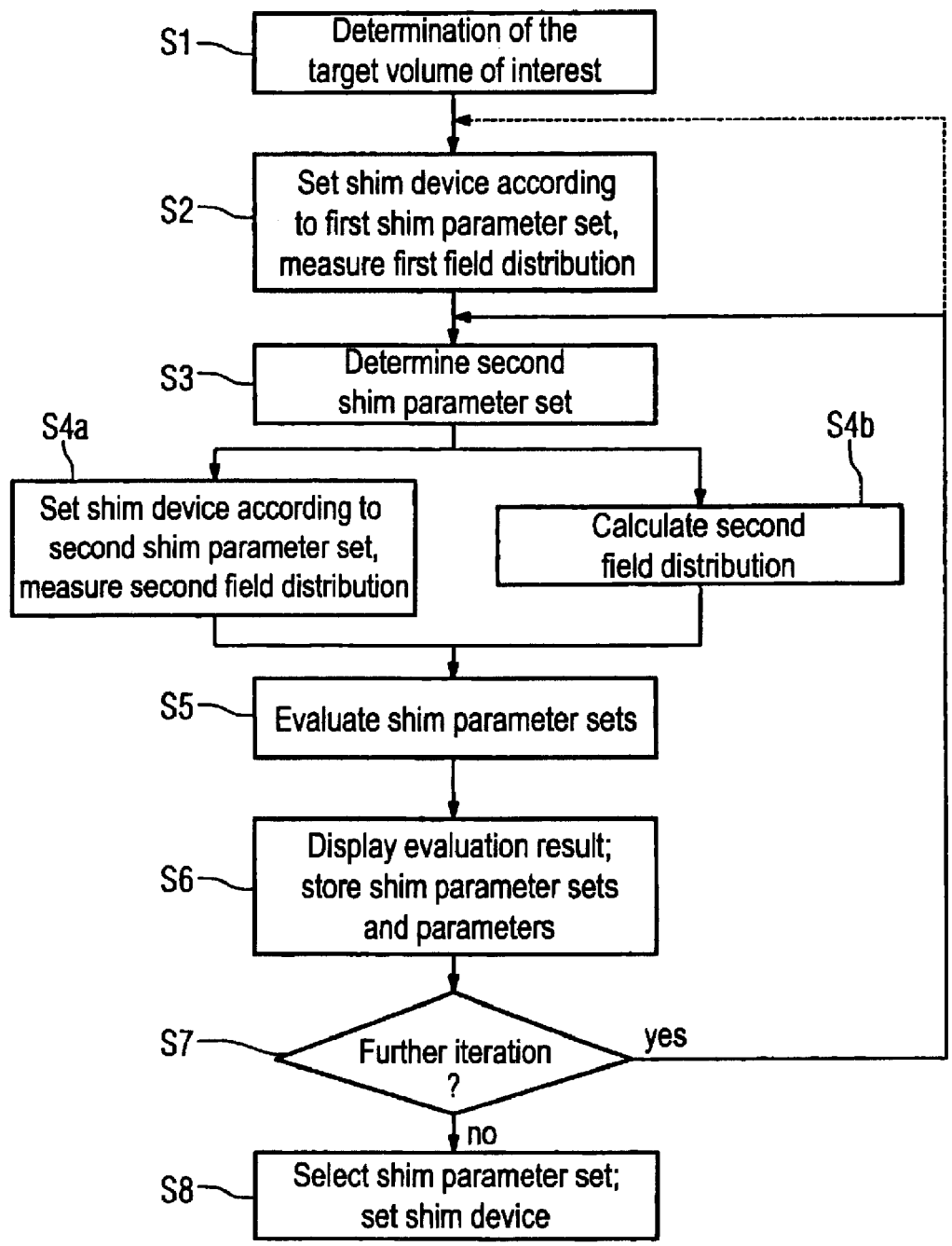
FIG. 2 is a flowchart of an embodiment of the inventive method.

FIG. 2 shows a flowchart of an embodiment of the inventive method. The target volume of interest is initially determined in step S1. This can ensue, for example, by a setting of suitable parameters through the input device 8, but can also ensue by (for example) marking in an overview image displayed on the monitor 9.

In step S2 the shim device is set according to the first shim parameter set and the first field distribution is measured. A comparison measurement is frequently implemented by the magnetic resonance apparatus 1, from which comparison measurement a direct conclusion about the inhomogeneities of the magnetic field in the volume of interest is possible.

A second shim parameter set is then determined in step S3 on the basis of the measured first field distribution. This occurs using an algorithm for optimization of the field homogeneity in the target volume. The first shim parameter set is selected as a starting point.

A second field distribution is subsequently determined on the basis of the second shim parameter set. This can ensue in two alternative ways, steps S4a and S4b.

In a first alternative, step S4a, the shim device 5 is set according to the second shim parameter set and the second field distribution is measured analogous to the first field distribution (see step S2).

It is alternatively also possible to calculate the second field distribution. For this purpose, the first field distribution is taken into account in step S4b since the algorithm supplies only results for the shim parameter set. Fields that describe the variations can then be calculated from the differences in the shim parameter sets, which variations are then in particular added point-by-point to the first field distribution. Terms of the third order and/or a higher order or higher orders of a spherical function expansion can be calculated in the calculation of the second field distribution. These terms can have a magnitude, even when they are not directly influenced by the shim device 5 (thus only indirectly), such that the field can be inhomogeneous in the target volume. They are therefore also taken into account for evaluation in the inventive method.

The evaluation of the shim parameter sets then ensues in step S5 via indirect comparison of the first field distribution and the second field distribution. A statistical evaluation of the field distribution initially ensues in the target volume. For example, for this a histogram of the deviations from an average value of the frequency for all voxels can be generated. The deviation from an average value of the frequency is a measure of the inhomogeneity of the field in the target volume.

Figure 3A:
FIG. 3A shows a histogram for evaluation of a first field distribution in accordance with the invention.
Figure 3B:
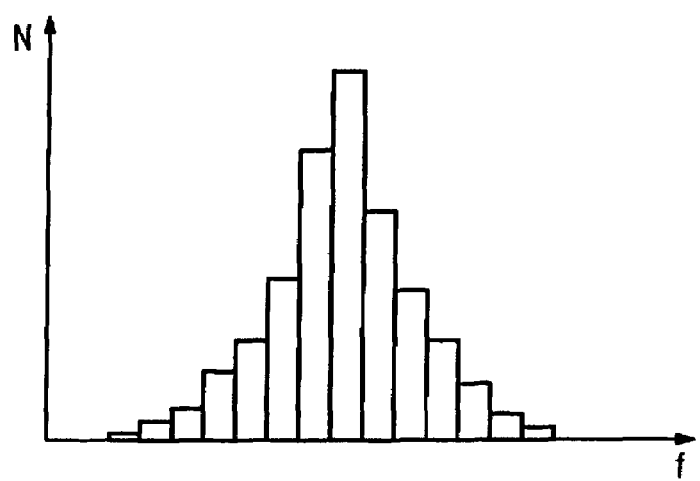
FIG. 3B shows a histogram for evaluation of a second field distribution in accordance with the invention.

An average value for the frequency is therefore initially determined under consideration of all voxels in the target volume. The deviation from the frequency is then determined for each voxel in the target volume. Specific intervals are now predetermined for these deviations, such that ultimately a histogram arises both for the first field distribution and for the second field distribution. Examples of such histograms for the first field distribution and the second field distribution are shown in FIGS. 3A and 3B. The frequency intervals are thereby respectively shown on the abscissa, the frequency on the ordinate. A distribution accordingly results whose characteristics can given information about the homogeneity of the field in the target volume. Given a good homogeneity a smaller scattering of these deviations from the average value of the frequency is present.

A parameter describing the homogeneity of the field in the target volume (thus a quality parameter that indicates the quality of the shim parameter set) can now be determined from the histograms presented in FIG. 3A and FIG. 3B. In the present case the full width half maximum (FWHM) is determined as a parameter reflecting the characteristics of the histogram. As follows in the example from the consideration of the histograms presented in FIG. 3A and FIG. 3B, the full width half maximum in FIG. 3B is smaller, meaning that a more homogeneous field distribution exists in the target volume in FIG. 3B. By comparison of the full width half maximum as a quality parameter, a conclusion can be made about with which shim parameter set a higher homogeneity can be achieved in the target volume. In the examples shown in FIG. 3A and FIG. 3B, this is the second shim parameter set, such that it can be assumed that the algorithm has satisfactorily converged and actually leads to an optimization of the shim settings.

In step S6 the evaluation result is displayed on the monitor 9 and the shim parameter sets in addition to the full width half maximums (thus the quality parameters) are stored in a storage device in the control device 6.

In step S7 it is then checked whether a further iteration step should occur. This can ensue at the instruction of an operator, however can also ensue automatically when a threshold for the homogeneity to be achieved (here thus a threshold for the full width half maximum) has been established. If the threshold is exceeded, a further iteration step occurs. Even given such an automation it is naturally possible for the user to interrupt the process at any time so that it cannot lead to an endless loop (for example given a divergence of the algorithm). In order to prevent such an occurrence, a maximum number of allowed iterations can be established.

If a further iteration step should be implemented, the second shim parameter set is thus used as a new first shim parameter set and either the steps S2-S7 or S3-S7 are repeated. In principle the step S2 (measurement of the first field distribution) do not have to be implemented since the first field distribution was already determined as a second field distribution in the preceding iteration step. However, if this was only calculated (step S4b), it can be reasonable to measure this again. This option is represented by the dashed line in FIG. 2.

If it is established in step S7 that no further iteration should be implemented, for example because an operator gave this instruction because a maximum number of iterations has been reached or because the threshold has been under-run, the selection of the optimal suitable shim parameter set according to which the shim device 5 is then set ensues in step S8. This selection can ensue manually by a user. It is also possible for the control device 6 to subsequently implement this selection automatically, for example by adopting to shim parameter set for which the smallest full width half maximum was determined. In particular all shim parameter sets stored in the storage device as well as their full width half maximums are taken into account, and possibly displayed, for this purpose. It may also occur that the optimum was already found during an iteration that was not the last iteration step, and the algorithm subsequently exhibited a divergence.

The acquisition of the images can now ensue after setting the shim device 5 according to the best shim parameter set.

Although modifications and changes may be suggested by those skilled in the art, it is the intention of the inventors to embody within the patent warranted hereon all changes and modifications as reasonably and properly come within the scope of their contribution to the art.

We claim as our invention:

1. A method for determining and evaluating a shim parameter set for controlling a shim device in a magnetic resonance apparatus, comprising the steps of:
    setting a shim device of a magnetic resonance apparatus using a first shim parameter set;
    measuring a first field distribution in a body region of a subject in the magnetic resonance apparatus encompassing a target volume from which magnetic resonance data are to be acquired;
    determining a second shim parameter set using an optimization algorithm that optimizes field homogeneity in the target volume based on said first shim parameter set and based on said first field distribution;
    determining a second field distribution based on said second shim parameter set;
    evaluating said first and second shim parameter sets by direct or indirect comparison of said first field distribution and said second field distribution in said target volume to obtain an evaluation result; and
    setting said shim device, to produce an optimally set shim device, based on said evaluation result.

2. A method as claimed in claim 1 comprising visually displaying said evaluation result.

3. A method as claimed in claim 1 wherein said evaluation result identifies which of said first or second parameter sets produces a better homogeneity in said target volume, and automatically setting said shim device using said one of said first or second shim parameter sets.

4. A method as claimed in claim 1 comprising evaluating said first and second shim parameter sets by statistically evaluating said first and second field distributions in said target volume.

5. A method as claimed in claim 4 comprising determining at least one first parameter that describes the homogeneity in said target volume from said first field distribution, determining at least one second parameter that describes the homogeneity in the target volume from said second field distribution, and evaluating said first and second shim parameter sets by comparing said at least one first parameter and said at least one second parameter.

6. A method as claimed in claim 5 comprising obtaining a plurality of first measurement values from said first field distribution and generating a first histogram from said first measurement values or quantities derived from said first measurement values, and determining said at least one first parameter as a parameter of said first histogram, and obtaining second measurement values from said second field distribution and generating a second histogram from said second measurement values or quantities derived from said second measurement values, and determining said at least one second parameter as a parameter of said second histogram.

7. A method as claimed in claim 6 wherein said first measurement values are frequency measurement values of said first field distribution and wherein said first histogram is a histogram representing deviation of said first frequency measurement values from an average of said first frequency measurement values, and wherein said second measurement values are frequency measurement values of said second field distribution and said second histogram is a histogram representing deviation of said second frequency measurement values from an average of said second frequency measurement values.

8. A method as claimed in claim 6 wherein said at least one first parameter is a full width half maximum of said first histogram and wherein said at least one second parameter is a full width half maximum of said second histogram.

9. A method as claimed in claim 1 comprising determining said second field distribution by a measurement after setting said shim device according to said second shim parameter set.

10. A method as claimed in claim 1 comprising determining said second field distribution by calculation dependent on said first field distribution.

11. A method as claimed in claim 10 comprising calculating said second field distribution with terms of at least a third order of a spherical function expansion.

12. A method as claimed in claim 1 comprising determining a further shim parameter set and a further field distribution from a last-determined shim parameter set in an additional iteration, and evaluating said further field distribution by direct or indirect comparison with a field distribution produced by said last-determined shim parameter set.

13. A method as claimed in claim 12 comprising implementing multiple further iterations with respective further shim parameter sets and respective further field distributions.

14. A method as claimed in claim 12 comprising determining whether to implement said iteration by identifying whether a threshold for improvement of the homogeneity in the target volume has been satisfied.

15. A method as claimed in claim 12 comprising implementing said further iteration according to an instruction of an operator of the magnetic resonance apparatus.

16. A method as claimed in claim 12 comprising for each iteration, storing the evaluation result and the shim parameter sets corresponding thereto in a memory and, after a last iteration, automatically selecting one of the stored shim parameter sets for setting said shim device.

17. A magnetic resonance apparatus comprising:
    a magnetic resonance scanner configured to interact with a subject to acquire magnetic resonance data from a target volume of the subject;
    a shim device operable to shim a magnetic field in said target volume to obtain a homogeneity of said magnetic field in said target volume; and a control device that operates said shim device by setting said shim device using a first shim parameter set, measuring a first field distribution in a body region of a subject in the magnetic resonance scanner encompassing the target volume, determining a second shim parameter set using an optimization algorithm that optimizes field homogeneity in the target volume based on said first shim parameter set and based on said first field distribution, determining a second field distribution based on said second shim parameter set, evaluating said first and second shim parameter sets by direct or indirect comparison of said first field distribution and said second field distribution in said target volume to obtain an evaluation result, and setting said shim device, to produce an optimally set shim device, based on said evaluation result.

* * * * *